United States Patent
Maeda et al.

(10) Patent No.: US 10,031,612 B2
(45) Date of Patent: Jul. 24, 2018

(54) CAPACITIVE TOUCH SWITCH PANEL

(71) Applicants: NORITAKE CO., LIMITED, Aichi (JP); NORITAKE ITRON CORPORATION, Mie (JP)

(72) Inventors: Tadami Maeda, Mie (JP); Isamu Kanda, Mie (JP); Koji Kato, Aichi (JP); Takahiro Okamoto, Aichi (JP); Hitoshi Sakuda, Mie (JP); Misa Yamanaka, Mie (JP); Naoya Katsumura, Mie (JP); Yuuki Nakayama, Mie (JP)

(73) Assignees: NORITAKE CO., LIMITED, Aichi (JP); NORITAKE ITRON CORPORATION, Mie (JP)

( * ) Notice: Subject to any disclaimer, the term of this patent is extended or adjusted under 35 U.S.C. 154(b) by 0 days.

(21) Appl. No.: 15/028,385

(22) PCT Filed: Sep. 19, 2014

(86) PCT No.: PCT/JP2014/074943
§ 371 (c)(1),
(2) Date: Apr. 8, 2016

(87) PCT Pub. No.: WO2015/053062
PCT Pub. Date: Apr. 16, 2015

(65) Prior Publication Data
US 2016/0253029 A1    Sep. 1, 2016

(30) Foreign Application Priority Data

Oct. 9, 2013  (JP) .................................. 2013-211513
Oct. 9, 2013  (JP) .................................. 2013-211517

(51) Int. Cl.
| | | |
|---|---|---|
| G06F 3/041 | (2006.01) | |
| G06F 3/044 | (2006.01) | |
| H03K 17/96 | (2006.01) | |

(52) U.S. Cl.
CPC ............ *G06F 3/0416* (2013.01); *G06F 3/044* (2013.01); *H03K 17/9622* (2013.01);
(Continued)

(58) Field of Classification Search
CPC ................... G06F 3/0416; G06F 3/044; G06F 2203/04101; G06F 2203/04112;
(Continued)

(56) References Cited

U.S. PATENT DOCUMENTS 3,961,120 A *  6/1976  Hearn ...................... C03C 17/04
                                                             427/209
6,207,268 B1 *  3/2001  Kosaka .................. B41M 5/265
                                                             428/206
(Continued)

FOREIGN PATENT DOCUMENTS

| CN | 102243548 A | 11/2011 |
| CN | 103001624 A | 3/2013 |

(Continued)

OTHER PUBLICATIONS

International Search Report dated Oct. 28, 2014.
English Abstract for CN 103029371 A dated Apr. 10, 2013.

*Primary Examiner* — Jose Soto Lopez
(74) *Attorney, Agent, or Firm* — Hedman & Costigan, P.C.; James V. Costigan; Kathleen A. Costigan

(57) ABSTRACT

Provided is a capacitive touch switch panel on which it is possible to form a transparent sensor electrode having high quality design shape and reduced reflection of visible light, and which moreover has excellent appearance and ample environmental resistance. This capacitive touch switch panel (Continued)

1 is provided with a glass substrate 2, and with a sensor part 3 formed on this glass substrate 2. The sensor part 3 has a sensor electrode 4, this sensor electrode 4 comprising an Al thin film formed by sputtering or vacuum deposition into a switch configuration on the glass substrate 2 at the opposite surface side 2b from a touch surface 2a, the sensor part 3 having an intermediate layer between the glass substrate 2 and at least a portion of the Al thin film. This intermediate layer comprises a thin film that includes at least one metal selected from Cr, Mo, and W.

9 Claims, 12 Drawing Sheets

(52) U.S. Cl.
CPC .............. *G06F 2203/04101* (2013.01); *G06F 2203/04103* (2013.01); *G06F 2203/04112* (2013.01); *H03K 2217/96066* (2013.01); *H03K 2217/960755* (2013.01)

(58) Field of Classification Search
CPC ...... G06F 2203/04103; H03K 17/9622; H03K 2217/960755; H03K 2217/96066
See application file for complete search history.

(56) References Cited

U.S. PATENT DOCUMENTS

| | | | | |
|---|---|---|---|---|
| 2002/0149570 | A1* | 10/2002 | Knowles | H03K 17/96 345/173 |
| 2010/0109978 | A1* | 5/2010 | Kim | H05K 9/0096 345/32 |
| 2010/0117977 | A1* | 5/2010 | Yoshino | G06F 3/044 345/173 |
| 2011/0279398 | A1* | 11/2011 | Philipp | G06F 3/044 345/174 |
| 2012/0154887 | A1* | 6/2012 | Kim | G02B 1/116 359/230 |
| 2013/0062182 | A1* | 3/2013 | Tokura | H03K 17/962 200/600 |
| 2013/0153392 | A1* | 6/2013 | Kawaguchi | H03K 17/962 200/600 |
| 2013/0168138 | A1* | 7/2013 | Yamazaki | G06F 3/041 174/253 |
| 2013/0181944 | A1* | 7/2013 | Lee | G06F 3/044 345/174 |
| 2014/0091708 | A1* | 4/2014 | Tokura | H03K 17/9622 315/73 |
| 2014/0370209 | A1* | 12/2014 | Walp | E06B 3/6604 428/34 |

FOREIGN PATENT DOCUMENTS

| | | |
|---|---|---|
| CN | 103003781 A | 3/2013 |
| CN | 103029371 A | 4/2013 |
| CN | 103080876 A | 5/2013 |
| EP | 2592533 A1 | 5/2013 |
| EP | 2593852 A2 | 5/2013 |
| FR | 2980006 A1 | 3/2013 |
| JP | 56-85325 U | 7/1981 |
| JP | 57-154747 A | 9/1982 |
| JP | 2006-244292 A | 9/2006 |
| JP | 2010-258274 A | 11/2010 |
| JP | 2012-054109 A | 3/2012 |
| JP | 2013-077555 A | 4/2013 |
| JP | 2013-093155 A | 5/2013 |
| JP | 2013-531317 A | 8/2013 |
| KR | 10-2012-0009181 A | 2/2012 |
| KR | 10-2013-0100950 A | 9/2013 |
| TW | 201213956 A1 | 4/2012 |
| TW | 201214228 A | 4/2012 |
| TW | 201325089 A1 | 6/2013 |
| WO | 2012/005205 A1 | 1/2012 |
| WO | 2012/008759 A2 | 1/2012 |
| WO | 2012/029801 A1 | 3/2012 |

* cited by examiner (a)

(b)

CAPACITIVE TOUCH SWITCH PANEL

TECHNICAL FIELD

The present invention relates to a capacitive touch switch panel for detecting, from changes in capacitance, when a user's finger or the like has come into proximity to a prescribed location that corresponds to an electrode; and in particular relates to a capacitive touch switch panel provided with a proximity sensor that is disposed on a glass substrate.

TECHNICAL BACKGROUND

In the field of household electronic appliances, AV equipment, PC/OA equipment, industrial machinery, and other electronic devices, capacitive type touch switch panels are used as one type of input means to the equipment. FIG. 11 and FIG. 12 show conventional capacitive switch panels in side view. The capacitive touch switch panel 11 shown in FIG. 11 has a structure in which a switch design 12a is produced on a cover 12 made of an acrylic or other resin by printing or laser trimming, sensor electrodes 13 are provided on a printed circuit board (PCB) 14, and the components are laminated together. A control part 15 is mounted on the PCB 14 as well. In the capacitive touch switch panel 11' shown in FIG. 12, on the other hand, a control part 15 is situated to the outside, and connected to the touch switch panel 11' via a plastic flexible printed circuit (FPC) 16.

In capacitive touch switch panels having these configurations, when the surface of the cover 12 is touched with a finger, capacitive coupling between a sensor electrode 13 and the finger occurs, and the capacitance of the electrode changes. The sensor electrodes 13 are distributed at multiple locations corresponding to the switch design, and wires are apportioned to the sensor electrodes 13, the sensor electrodes 13 and the control part 15 being connected by the aforementioned wires (in FIG. 12, including the FPC 16). In the control part 15, the amount of change in the capacitance of the sensor electrodes 13 is digitized, determining contact by a finger to have occurred when the value thereof exceeds a predetermined threshold value. In so doing, the control part 15 can detect changes in capacitance of any of the sensor electrodes 13, and can detect which section of the touch with has been touched with the finger.

By way of a capacitive touch switch having fewer parts and improved appearance, there has been proposed one provided with switch electrodes and dummy electrodes comprising metal thin films deposited onto a substrate such as a glass substrate (Patent Document 1). The switch electrodes in this switch are configured to include markings (designs) of prescribed shape. The metal thin films are produced by depositing a material such as aluminum, an aluminum alloy (aluminum-tantalum or the like), niobium, molybdenum, gold, silver, copper, or the like onto a glass substrate comprising soda lime glass or the like, by a method such as sputtering, vapor deposition, or CVD, followed by exposure in a prescribed pattern, and then etching. With the aim of protecting the switch electrodes made of metal thin film, a paste of a black pigment, white pigment, or other coloring pigment mixed into a low-softening point glass frit is printed over the electrodes and baked to form an insulating member (protective layer). As shown in FIG. 5 in Patent Document 1, the printed board and connector terminals on the glass substrate are connected via a FPC and connectors.

PRIOR ARTS LIST

Patent Documents

Patent Document 1: Japanese Laid-Open Patent Publication No. 2013-77555

SUMMARY OF THE INVENTION

Problems to be Solved by the Invention

When a cover made from an acrylic or other resin is employed, there is a risk that when the product is used for an extended period in harsh environments of high temperature, low temperature, high humidity, and the like, the resin cover surface and/or the electrode surfaces may degrade. Moreover, in instances in which a switch design is formed by printing or the like, there are limits in terms of feasible designs; for example, it is difficult to form fine patterns. In contrast to this, with the capacitive touch switch of Patent Document 1, it is possible to improve the environmental resistance by providing a glass substrate with switch electrodes (sensor electrodes) of metal thin film, and fine patterning is possible as well.

However, when the switch electrodes are made from an aluminum thin film, the switch electrodes are all the same color (glossy silver), and switch electrodes of other colors cannot be formed. In cases in which it is attempted to form markings or the like of other colors in the switch electrode sections, it would be conceivable for sections corresponding to the markings to be constituted by openings where the switch electrode is not fully formed, and to tint the back surface coating to the desired color. However, in this case, touch detection will not be possible at the openings where the switch electrode is absent. Another conceivable method is to form the switch electrode (auxiliary electrode) to a fine lattice pattern so as to be substantially transparent to the eye, rather than forming full openings; however, when the electrode is formed from an aluminum thin film, the reflectance of visible light (approximately 400-700 nm wavelengths) is exceedingly high, resulting in a tendency to produce glare, thereby diminishing the visibility characteristics (transmissivity) from the touch screen.

Moreover, depending on the material employed in the metal thin film of Patent Document 1, the environmental resistance is not necessarily improved. For example, when copper is used, the potential fields of use are limited due to poor corrosion resistance. Additionally, when noble metals such as gold or silver are used, the high price leads to high product costs.

Aluminum, by contrast, has excellent corrosion resistance, and is lower in cost than the noble metals, but when used to form a transparent electrode, the aforementioned problem resulting from high visible light reflectance is encountered. Additionally, even in cases in which a thin film made of aluminum of excellent corrosion resistance is employed, and an additional protective layer of low-softening point glass frit is provided, the product, when installed outdoors or in proximity to an industrial machine such as a heater or the like, and is used in a harsh environment of low temperature or high temperature (about −50° C. to 430° C.), in the presence of moisture (high humidity), acids, alkalies, dust, or the like, will not be able to sufficiently withstand such an environment. Moreover, when exposed to strong vibration or pressure, there is a risk of breakage of the electrode wiring, which is made of metal thin film. Particularly in cases in which a resin FPC is employed to connect to an external control part, there is a risk of degradative damage to the section in question in the harsh environments mentioned above.

The present invention was contrived in order to address such problems, it being an object thereof to provide a capacitive touch switch panel on which it is possible to form a transparent sensor electrode having high quality design shape and reduced reflection of visible light, and which moreover has excellent appearance and ample environmental resistance.

Means to Solve the Problems

The capacitive touch switch panel of the present invention is provided with a glass substrate, and a sensor part formed on this glass substrate, the capacitive touch switch panel being characterized in that the sensor part has a sensor electrode, the sensor electrode comprising an aluminum (hereinafter abbreviated "Al") thin film formed by sputtering or vacuum deposition in a switch configurations on the glass substrate at the opposite surface side from the touch surface thereof, the sensor part having an intermediate layer between the glass substrate and at least a portion of the aluminum thin film, and the intermediate layer comprising a thin film that contains at least one metal selected from chromium (hereinafter abbreviated "Cr"), molybdenum (hereinafter abbreviated "Mo"), and tungsten (hereinafter abbreviated "W").

The capacitive touch switch panel is characterized by having light-transmissive parts in at least portions of the Al thin film, the light-transmissive parts having a lattice pattern in which the Al thin film and the intermediate layer overlap, with the lattice interstices constituting openings.

The capacitive touch switch panel is characterized in that the sensor part has a protective layer for protecting the sensor electrode, the protective layer being formed on the glass substrate on the surface side on which the Al film has been formed.

The capacitive touch switch panel is characterized in that the sensor part has a light-diffusion layer for diffusing light from an illuminating light source, the light-diffusion layer being formed in spaces in the sensor electrode that is formed on the glass substrate on the surface side on which the Al film has been formed, or the layer being formed at locations of light-transmissive parts formed in the sensor electrode.

The capacitive touch switch panel is characterized in that the intermediate layer includes at least one oxide selected from Al oxides and titanium (hereinafter abbreviated "Ti") oxides.

The capacitive touch switch panel is characterized by having, in an integrated arrangement, an illuminating light source, and a control part for performing touch detection by the sensor part and for driving the illuminating light source.

The capacitive touch switch panel is characterized in that the capacitive touch switch panel has a cover glass disposed on the glass substrate on the surface where the sensor part is formed, the glass substrate and the cover glass being glass-sealed, the sensor part being arranged within the glass-sealed space, and the capacitive touch switch panel has an external connection terminal made of metal, which is connected to the sensor part and extends outside from the glass-sealed space. The capacitive touch switch panel is characterized in that the glass substrate and the cover glass are glass-sealed directly by sealing glass, without spacer members interposed therebetween. The capacitive touch switch panel is characterized in that the glass-sealed space interior is a vacuum, or is filled with an inert gas.

Advantageous Effects of the Invention

The capacitive touch switch panel of the present invention is provided with a glass substrate, and a sensor part formed on this glass substrate, the sensor part having a sensor electrode, the sensor electrode comprising an Al thin film formed by sputtering or vacuum deposition into a switch configuration on the glass substrate at the opposite surface side from the touch surface thereof, the sensor part having an intermediate layer between the glass substrate and at least a portion of the Al thin film, the intermediate layer comprising a thin film that includes at least one metal selected from Cr, Mo, and W. The panel therefore has a refined appearance due to transparent glass substrate and the metallic luster of the Al thin film (aluminum mirror surface), and exceptional design quality. Moreover, as sputtering or vacuum deposition is employed to form the Al thin film, it is possible through subsequent wet etching or the like to form a design shape, such as a finely patterned shape or the like, of higher quality than with printing. Further, because the prescribed intermediate layer is interposed between the glass substrate and the Al thin film, the panel appears black when viewed from the touch surface side, and sensors with which touch detection is possible can be formed. This makes it possible to form a glossy silver or black sensor electrode of switch design, with each of which sensors touch detection being possible.

The switch design panel and the sensor electrode can be provided in integrated form to a single glass substrate. Because a glass substrate is employed as the substrate, the panel is more highly resistant to discoloration and abrasion than in the case of a touch switch part made of resin. Moreover, because Al thin films are employed for the sensor electrode and the wiring, corrosion resistance is higher than when copper or the like is employed. For this reason, the capacitive touch switch panel of the present invention has ample environmental resistance and is highly reliable.

At least some of the Al thin film has light-transmissive parts, the light-transmissive parts having a lattice pattern in which the Al thin film and the intermediate layer overlap, with the lattice interstices constituting openings, and therefore a transparent sensor electrode that minimizes reflection of visible light can be formed.

The sensor part has a protective layer for protecting the sensor electrode, the protective layer being formed on the glass substrate on the surface side thereof on which the Al film has been formed, whereby corrosion of the sensor electrode or breakage due to static electricity can be prevented by the protective layer.

The sensor part has a light-diffusion layer for diffusing light from an illuminating light source, the light-diffusion layer either being formed in spaces in the sensor electrode that is formed on the glass substrate on the surface side thereof on which the Al film has been formed, or being formed at locations of light-transmissive parts formed in the sensor electrode, whereby uniform brightness can be produced in light-emitting regions of the touch surface.

The intermediate layer includes at least one oxide selected from Al oxides and Ti oxides, whereby the visible light reflectance can be reduced further.

The capacitive touch switch panel of the present invention in another aspect provides a module equipped in an integrated arrangement with an illuminating light source and a control part for performing touch detection by the sensor part and driving the illuminating light source, and therefore has exceptional ease of handling.

The capacitive touch switch panel of the present invention in another aspect has a cover glass disposed on the glass substrate on the surface thereof where the sensor part is formed, the glass substrate and the cover glass being glass-sealed, the sensor part being arranged within the glass-sealed space, and the panel having an external connection terminal made of metal, which is connected to the sensor part and extends outside from the glass-sealed space, whereby the mechanical strength and environmental resistance characteristics can be greatly improved, as compared to the case of a single glass sheet configuration, or the case in which a resin FPC is employed as the external connection terminal. For this reason, it is possible for the panel to be used in harsh environments that widely range in temperature from low temperature to high temperature (about −50° C. to 430° C.) or in which moisture acids, alkalis, dust, or the like are present. Moreover, breakage of the sensor electrode and the wiring, which are made from metal thin film, when subjected to strong vibration or pressure can be prevented.

Further, in this aspect, the glass substrate and the cover glass are glass-sealed directly by sealing glass without interposing spacer members, whereby complete cohesion of the panel interior can be attained, affording better mechanical strength. Moreover, the glass-sealed space interior is a vacuum, or is filled with an inert gas, whereby degradation of the sensor electrode can be minimized further.

DESCRIPTION OF THE EMBODIMENTS

Figure 1:
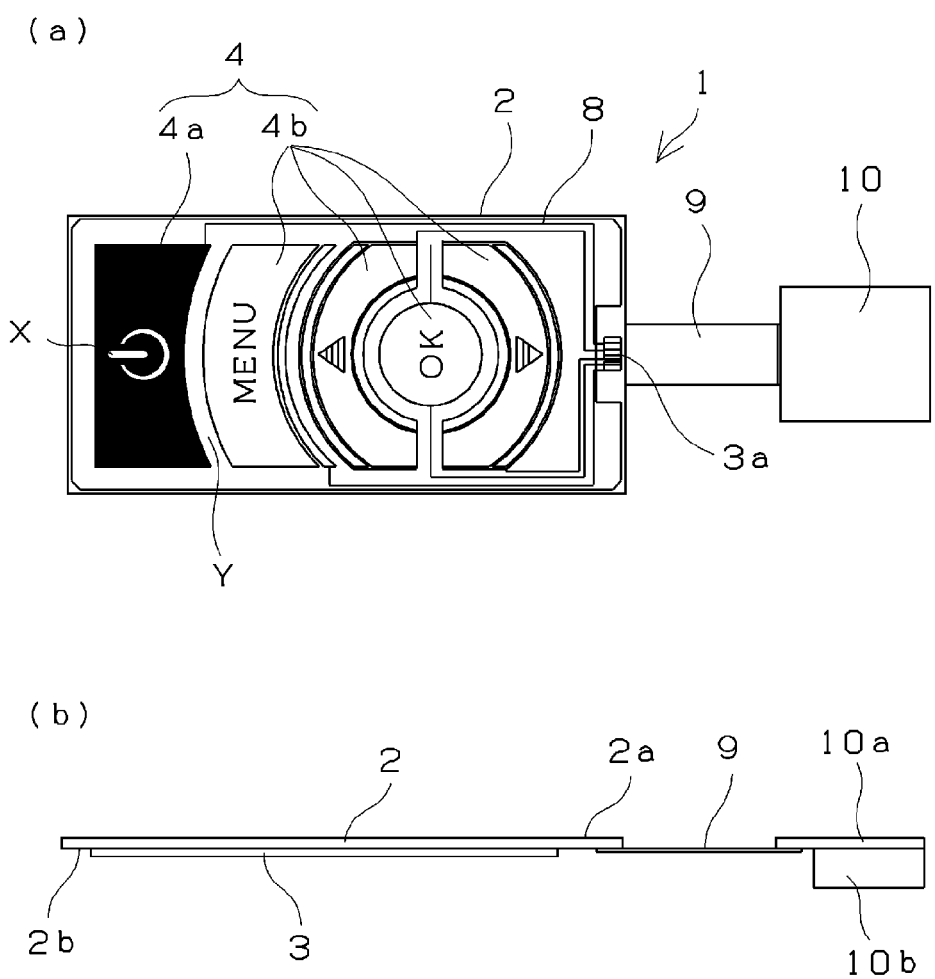
FIG. 1 is a front view and a side view showing an example of the capacitive switch panel of the present invention.
Figure 2:
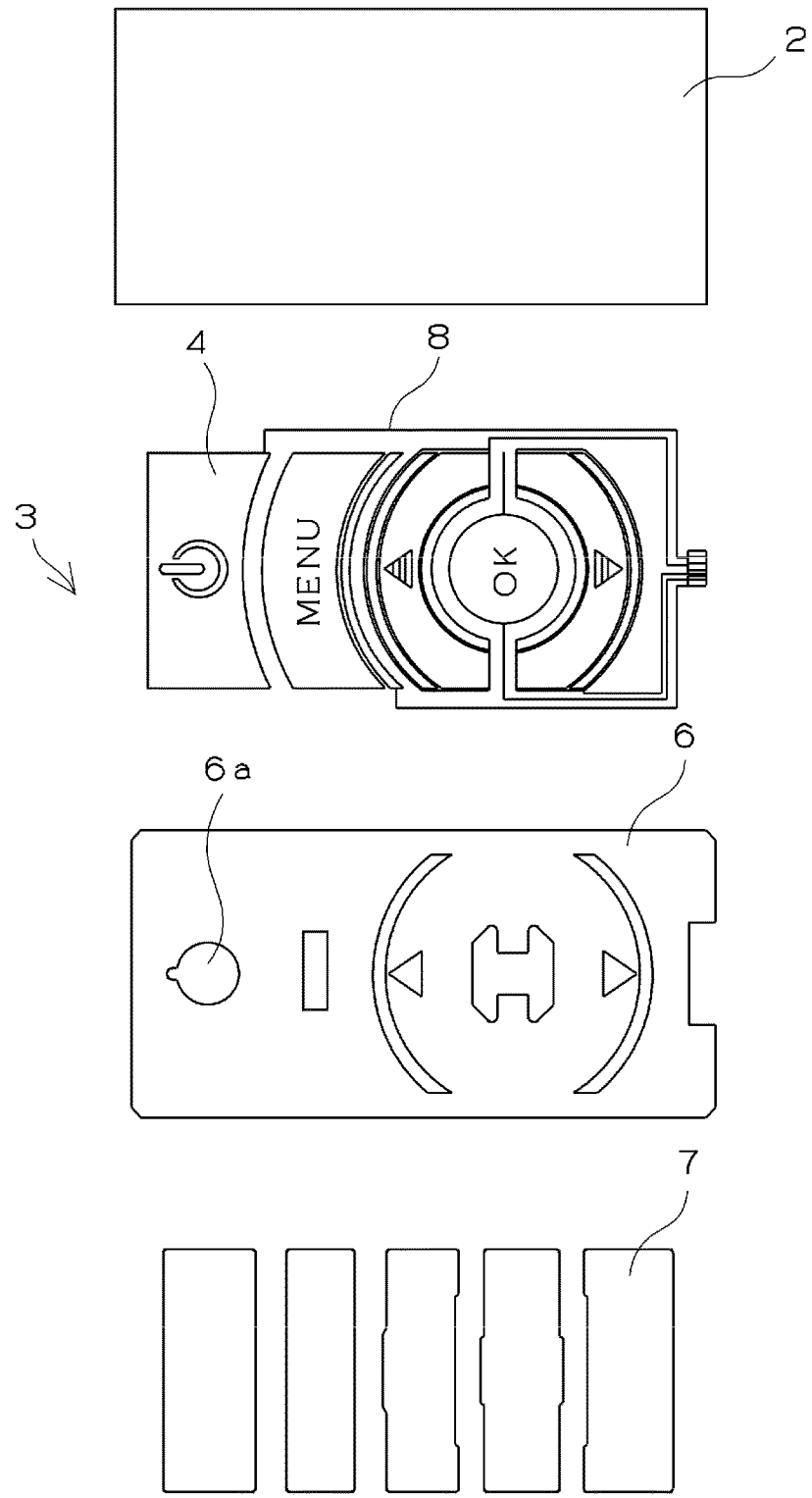
FIG. 2 an exploded view of the capacitive switch panel of FIG. 1.

An example of the capacitive touch switch panel of the present invention will be described on the basis of FIGS. 1 to 3. FIG. 1 (*a*) is a front view showing the capacitive switch panel, FIG. 1 (*b*) is a side view thereof, and FIG. 2 is an exploded view of the capacitive switch panel of FIG. 1. As shown in FIG. 1, the capacitive touch switch panel 1 is provided with a light-transmissive glass substrate 2, and a sensor part 3 formed on the glass substrate 2. The surface of the glass substrate 2 is a touch surface 2*a*, and the sensor part 3 is provided to the opposite face 2*b* from this touch surface 2*a*. The capacitive switch panel 1 has a connection terminal 3*a* that is connected to a sensor electrode 4 and wires 8 of the sensor part 3. The connection terminal 3*a* is arranged such that the wires are adjacent and run mutually parallel towards the outside of the substrate. A flexible printed circuit (FPC) 9 is connected to the connection terminal 3*a*, and a control part 10 is connected via the FPC 9. The control part 10 has a control circuit 10*b* for performing touch detection and the like, which is mounted on a PCB 10*a*.

The control part 10 may be a separate component set apart from the sensor part 3 as shown in FIG. 1; or arranged adjacently to or directly mounted on the sensor part 3. Separating the control part 10 from the sensor part 3 facilitates isolation from the outside environment. Additionally, by integrally disposing an illumination light source, such as an LED backlight, and a control substrate that includes the control part, on the back surface (the opposite side from the touch surface) of the sensor part to create a module, it is possible to achieve excellent ease of handling, and to easy incorporation the module as a replacement for an ordinary mechanical switch. When the switch is pressed, output can be open drain or asynchronous serial output.

The glass substrate 2 is a light-transmissive insulating substrate, for which there can be selected a soda lime glass, quartz glass, borosilicate glass, alkali-free glass that contains no alkali component, or the like. It is preferable to employ soda lime glass, which has high transparency, is used as window glass for general construction, and is very cheap. The thickness of the glass substrate 2 is about 0.5-5 mm, preferably about 1.8-3.0 mm.

The sensor electrode 4 is constituted by an Al thin film, and are disposed on the glass substrate on the surface at the side opposite from the touch surface. The Al thin film is formed by sputtering or vacuum deposition, which are vacuum processes employing a solid target (deposition material). It is possible for the wires 8 to be integrally formed at the same time as the sensor electrode 4. It is preferable to select sputtering as the vacuum process, as it is possible to form a uniform film thereby. Sputtering is a method that involves bombarding a solid target with accelerated argon ions, and depositing atoms or molecules that fly off from the target surface onto a glass substrate to form a film. In FIG. 1 (*a*), no Al thin film is formed in area Y.

There are no particular limitations as the method for patterning the Al thin film to prescribed switch shapes (designs) but it is preferable to employ known photo resolution technique, as by doing so it will be possible to accurately form the wires 8 connected to the sensor electrode 4, the wires of the fine lattice pattern of the light-transmissive parts, discussed later, and the like. For example, after forming an Al thin film on a glass substrate surface by sputtering or vacuum deposition, an etching pattern mask layer is formed by screen printing with a resist material, which is then wet etched by wet etching with a prescribed etching liquid, forming fine wires and switch shapes (designs). The thickness of the Al thin film is appropriately 500 nm-5,000 nm.

FIG. 2 shows, in order from the top, the glass substrate 2, and the sensor electrode 4, the wires 8, a protective layer 6, and a light-diffusion layer 7, which are laminated in this order on the glass substrate 2. Specifically, in the capacitive touch switch panel of this embodiment, the sensor electrode 4 (in portions of which the intermediate layer is present) and the wires 8 of the sensor part 3 on the opposite surface from the glass substrate 2 thereof have formed thereover the protective layer 6 and the light-diffusion layer 7, respectively, in that order. The protective layer 6 is a layer comprising an insulating material, discussed below, or the like, and having an opening 6a in a portion thereof, whereby light from an illuminating light source such as an LED backlight is transmitted to the necessary regions. In this instance, a prescribed intermediate layer is formed between the glass substrate 2 and at least portions of the sensor electrode 4 and the wires 8 comprising the Al thin film.

Figure 3:
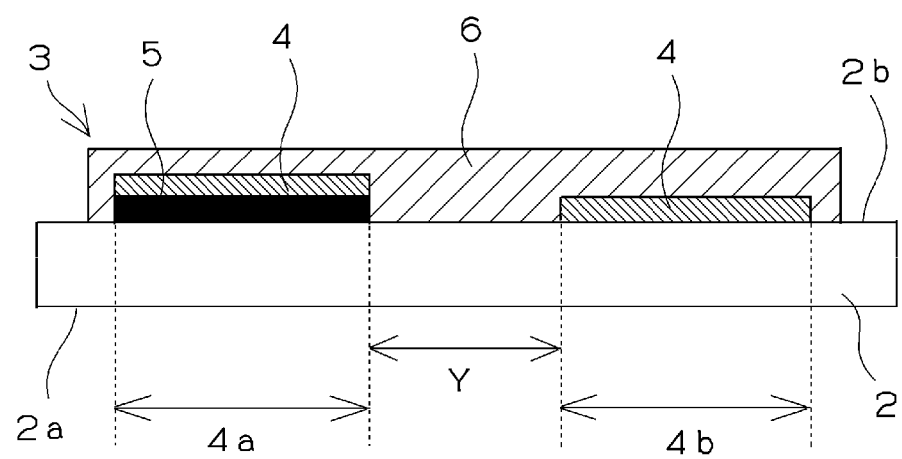
FIG. 3 is an enlarged schematic cross sectional view of the sensor part of FIG. 1.

FIG. 3 shows an enlarged schematic cross sectional view of the sensor part. As shown in FIG. 3, in the region of the switch 4a, an intermediate layer 5 is formed between the glass substrate 2 and the sensor electrode 4 comprising the Al thin film. The intermediate layer 5 is a thin film that includes (1) at least one metal selected from Cr, Mo, and W. The intermediate layer 5 is a layer that absorbs incident light through interference with visible light, and appears black (black layer). From the touch surface 2a, the switch 4a region appears black, the switch 4b region glossy sliver, and the section Y the same color as the protective layer 6 (e.g., black), respectively.

The intermediate layer 5 is formed directly on the surface of the opposite surface 2b of the glass substrate 2, by vacuum deposition or sputtering, for example. For the same reason as when forming the Al thin film discussed previously, it is preferable to select the aforedescribed sputtering for the intermediate layer 5. Patterning of the switch shapes (designs) is accomplished by wet etching or the like, and during the process it is preferable to select a liquid that can etch both the intermediate layer and the Al thin film materials (e.g., a phosphoric acid-based etching liquid), to achieve excellent manufacturing efficiency.

Figure 6:
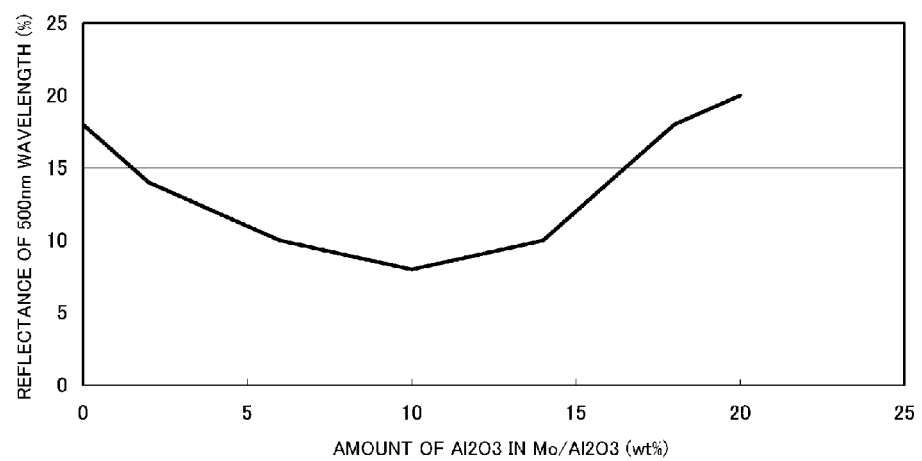
FIG. 6 is a diagram showing the effects of the mixture composition ratio of an intermediate layer on the reflectance.

In preferred practice, the intermediate layer 5 includes a prescribed amount of (2) at least one oxide selected from Al oxides and Ti oxides. $TiO_2$ may be cited as a Ti oxide, and $Al_2O_3$ as an Al oxide, respectively. Further reductions in reflectance may be achieved by including prescribed amounts of these oxides, as shown in FIG. 6, discussed below. In cases in which the intermediate layer is formed from a mixture of (1) at least one metal selected from Cr, Mo, and W and (2) at least one oxide selected from Al oxides and Ti oxides, and the mixture is used as the solid target (deposition material), thin films can be formed by vacuum deposition or sputtering.

In the capacitive touch switch panel of the present invention, the protective layer 6 is preferably provided in the outermost layer of the sensor part 3, on the surface side at which the Al thin film of the glass substrate has been formed, as shown in FIG. 2. By providing the protective layer, static electricity-induced breakage or corrosion of the sensor electrode can be prevented. An additional effect is to prevent scattering during breakage of the substrate due to some kind of shock. Further, improved break strength can be achieved. As the protective layer, there may be cited a coating film formed by printing and baking a thick layer of a low-melting point glass paste, or a coating film formed by printing and drying a thick layer of an organic resin paste. The protective layer can be tinted by mixing coloring pigments into the pastes, and switch designs can be tinted to multiple colors by having the protective layer be visible through spaces in the sensor electrode.

Additionally, as shown in FIG. 2, in the capacitive touch switch panel of the present invention, the light-diffusion layer 7 is preferably provided to spaces between the sensor electrode, or locations of the light-transmissive part (back surface) at which the sensor electrode are formed, on the surface side of the sensor part 3, on the surface side at which the Al thin film of the glass substrate has been formed. Light from the illuminating light source can be diffused by the light-diffusion layer, and even in cases in which the illuminating light source is small, uniform brightness can be produced in the light-emitting regions of the touch surface. As the light-diffusion layer, there may be cited a coating film that is formed by dispersing glass beads (4-60 μm particle diameter) into a low-melting point frit glass or resin paste that is then applied, and the low-melting point frit glass is baked, or the resin paste is dried.

The capacitive touch switch panel of the present invention utilizes the fact that the capacitance of an electrode changes upon capacitive coupling occurring between the sensor electrode and a finger. Widely known procedures can be adopted as the specific detection procedure.

Figure 4:
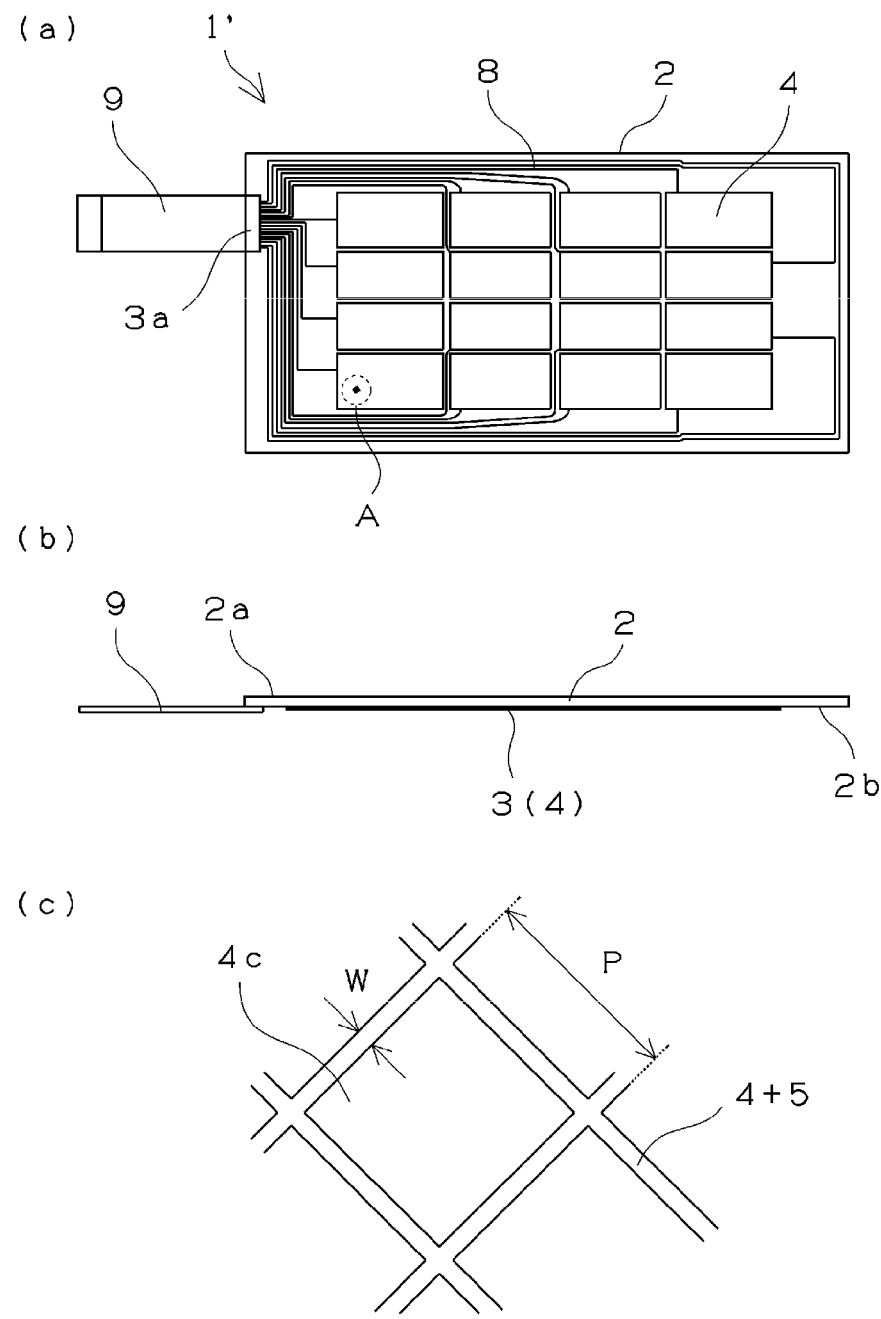
FIG. 4 is a front view and a side view showing another example of the capacitive switch panel of the present invention, and a fragmentary enlarged view of a sensor electrode.

Another example of the capacitive touch switch panel of the present invention will be described on the basis of FIG. 4. FIG. 4 (a) is a front view showing a capacitive switch panel, FIG. 4 (b) is a side view thereof, and FIG. 4 (c) is an enlarged view of part A in FIG. 4 (a). As shown in FIG. 4 (a) and FIG. 4 (b), this capacitive touch switch panel 1' is provided with a light-transmissive glass substrate 2 and a sensor part 3 formed on the glass substrate 2. The surface of the glass substrate 2 is a touch surface 2a, and the sensor part 3 is disposed on an opposite surface 2b from this touch surface 2a. A sensor electrode 4 has 4 rows×4 columns, for a total of 16, of switch shapes, to each of which are connected wires 8 connecting the switches to a control part (omitted from the illustration) via a connection terminal 3a and an FPC 9. In the drawing, the sensor part 3 does not have a protective layer or a light-diffusion layer, but these could be optionally provided, as in FIG. 2.

As shown in FIG. 4 (c), the switch-shaped sections have a lattice pattern in which the Al thin film (the sensor electrode 4) and an intermediate layer 5 overlap, with the lattice interstices constituting openings 4c. Here, openings refer to openings situated in double-layer sections of the sensor electrode and intermediate layer. This lattice pattern is a micro-lattice pattern in which switch-shaped sections (the aforementioned double-layer sections) constitute light-transmitting parts that appear transparent to the naked eye. This lattice pattern can be formed by first forming the intermediate layer 5 on the glass substrate 2 by sputtering or the like, forming an Al thin film (the sensor electrode 4) thereon, and then simultaneously etching the two materials. In the case of a lattice pattern, usually the line width W is 3-100 μm, and the line pitch P is about 0.5-1 mm. Provided that the shape is one that employs continuous fine lines, any shape, such as a hexagon, elongated rectangular shape or diamond shape, trapezoid, or the like, can be used.

With regard to the switch shapes (designs), in cases in which the Al thin film is to be formed to a color other than gloss silver, it would be conceivable for those sections to take the form of openings at which the sensor electrode is not fully formed, and for a desired colored layer to be displayed at the touch surface to be formed on the protective layer on the back surface; however, in such a case, touch detection will not be possible at the openings where the switch electrode is absent. Another conceivable method would be for the sensor electrode to be formed to a shape such as a micro-lattice pattern, rather than full openings; but as Al thin films have exceedingly high reflectance of visible light and tend to produce glare, the visibility characteristics of the touch screen will suffer. According to the present invention, however, by interposing the aforementioned intermediate layer between the glass substrate and the Al thin film, the film appears black when viewed from the touch surface side, while the sensor electrode is capable of touch detection. Further, the visible light reflectance is reduced, glare is minimized even when patterned to a shape such as a micro-lattice pattern, and the visibility of the color and shape of the protective layer or the like provided on the back surface is ensured.

Figure 5:
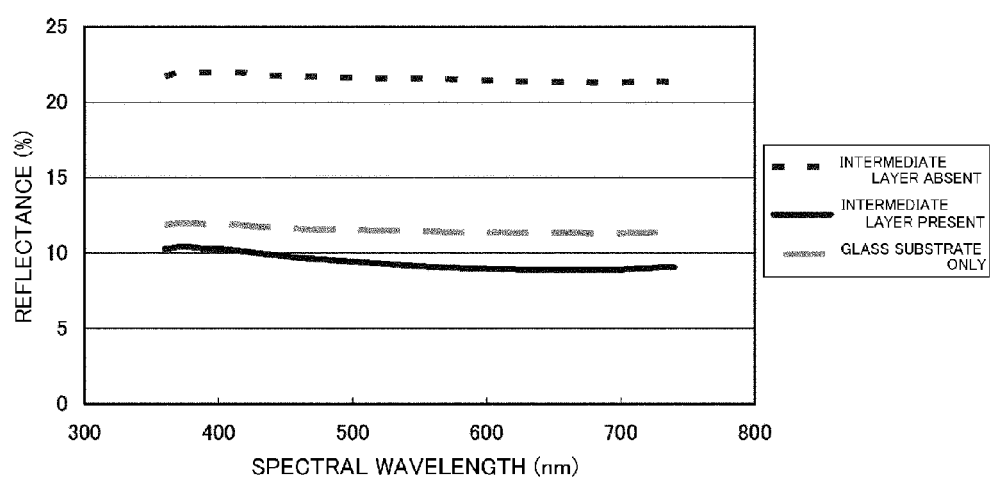
FIG. 5 is a diagram showing the effects of the presence of an intermediate layer on the spectral characteristics of reflectance.

FIG. 5 shows an example of the spectral characteristics of reflectance observed when the intermediate layer is present and absent. In FIG. 5, "intermediate layer present" refers to an intermediate layer (100 nm) formed on a soda lime glass substrate (0.7 mm) by sputtering using a target of a mixture of Mo and $Al_2O_3$ (containing 10 wt % of $Al_2O_3$), and having formed thereon a 99% pure Al thin film (1,000 nm) by sputtering. "Intermediate layer absent" refers to the above configuration, but without forming the intermediate layer, and instead forming an Al thin film (1,000 nm) only. As shown in FIG. 5, in the absence of the intermediate layer, the reflectance is markedly higher than from the glass substrate [alone]. In contrast to this, by providing the aforementioned intermediate layer, conversely, the reflectance will be lower than with the glass substrate alone. It will also be appreciated that the spectral characteristics are flat with respect to the entire range of wavelengths, and there is no coloration.

In the case in which the intermediate layer is a layer of a mixture of (1) at least one metal selected from Cr, Mo, and W and (2) at least one oxide selected from Al oxides and Ti oxides, the reflectance will be affected by the composition ratio of the mixture. Therefore, in order to form a film of the desired composition ratio, during film deposition it is preferable to employ a solid target having the form of a mixture in which the metal(s) and the oxide(s) are respectively mixed uniformly in the desired composition ratio beforehand. In the intermediate layer, the metal species of the simple metal (1) and the metal species of the oxide (2) differ, and therefore deposition of a film having the aforementioned composition cannot be accomplished by methods such as employing a solid target of a simple metal, and employing a mixed gas of argon and oxygen.

The mixture composition ratio of the intermediate layer is preferably one in which the oxide content, expressed in relation to the total amount of the mixture (simple metal+ oxide, is 2-16 wt %. When the oxide content is less than 2 wt %, metallic gloss begins to appear, posing a risk that reflectance will not be reduced. When the oxide content exceeds 16 wt %, on the other hand, cloudiness begins to appear, posing a risk that reflectance will not be reduced.

An example of the effect of the mixture composition ratio of the intermediate layer is shown in FIG. 6. FIG. 6 [depicts the result of] forming an intermediate layer (100 nm) onto a soda lime glass substrate (0.7 mm) by sputtering a target of a mixture of Mo and $Al_2O_3$, forming thereover a 99% pure Al thin film (1,000 nm) by sputtering, then measuring the change in reflectance of visible light (500 nm wavelength) while varying the amount (wt %) of $Al_2O_3$ in the mixture. As shown in FIG. 6, when a mixture of Mo and $Al_2O_3$ is employed for the intermediate layer, an $Al_2O_3$ content of 2-16 wt % is preferred, with 5-15 wt % being more preferred, and 8-12 wt % being especially preferred.

The appropriate thickness of the intermediate layer is 5-500 nm. At less than 5 nm, satisfactory black color is not obtained, and in some instances reflectance is not reduced. In excess of 500 nm, on the other hand, there is a risk that the reflected light-reducing effect produced by the visible light interference effect will not be obtained. [A thickness of] 50-200 nm is more preferable. The film thickness is determined for each material, according to the refractive index of the intermediate layer materials.

Figure 7:
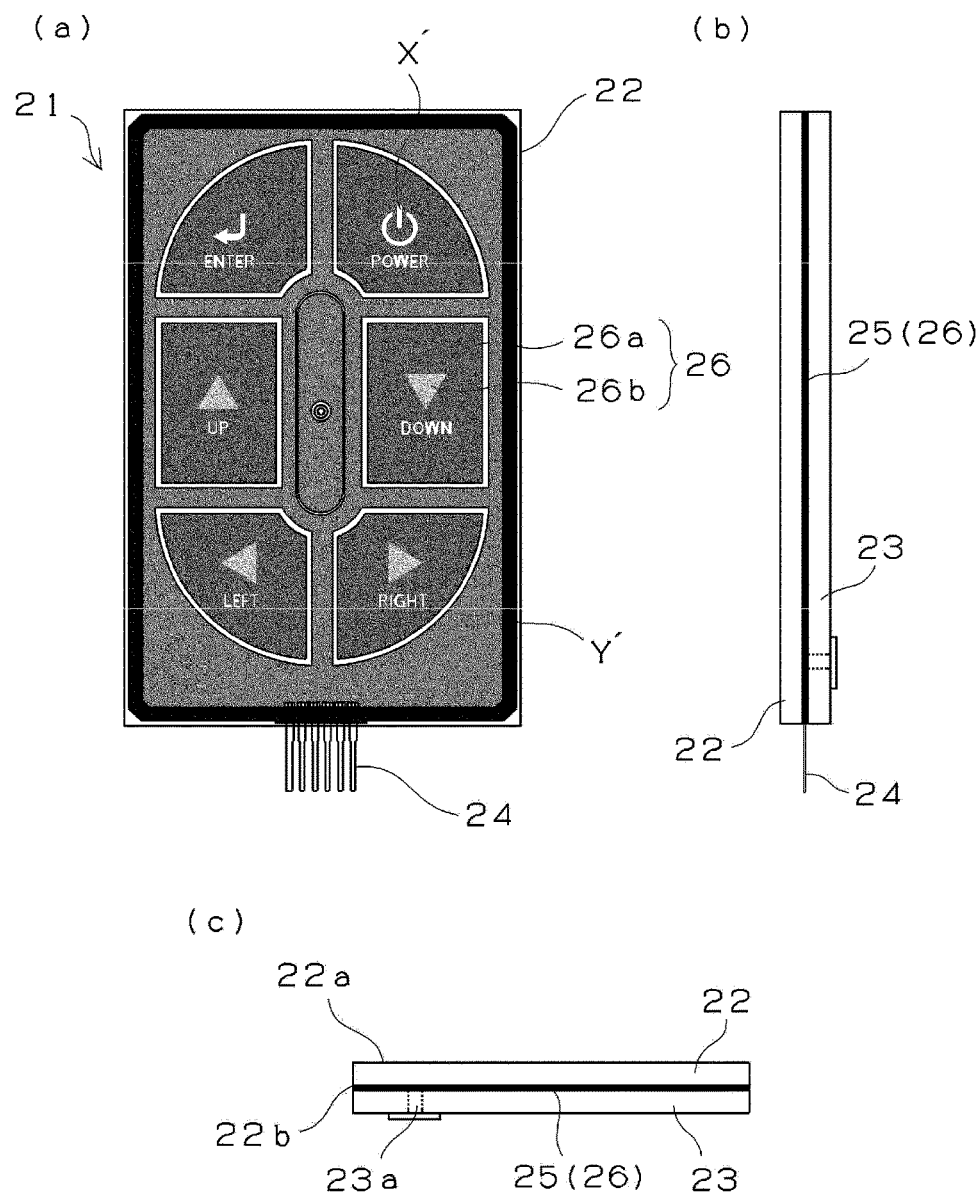
FIG. 7 is a plan view, a side view, and a front view showing another example of the capacitive switch panel of the present invention.

Yet another example of the capacitive touch switch panel of the present invention will be described on the basis of FIG. 7 and FIG. 8. FIG. 7 (a) is a plan view showing the capacitive touch switch panel, FIG. 7 (b) is a side view thereof, and FIG. 7 (c) is a front view thereof. As shown in FIG. 7, this capacitive touch switch panel 21 is provided with a light-transmissive glass substrate 22, a sensor part 25 formed on an opposite surface 22b side from a touch surface 22a of the glass substrate 22, and a cover glass 23 disposed on the surface (22b) of the glass substrate 22 on which the sensor part 25 is formed. The sensor part 25 has a sensor electrode 26 comprising an Al film formed on the opposite surface 22b side of the glass substrate 22. In this capacitive touch switch panel 21, the glass substrate 22 and the glass cover 23 are glass-sealed, and the sensor part 25 is arranged inside the glass-sealed space. The panel also has a lead frame 24, which is an external connection terminal made of metal, that is connected to the sensor part 25 and extends to the outside from the glass-sealed space. The lead frame 24 is connected by wires (omitted from the illustration) to the sensor electrode of the sensor part 25.

The capacitive touch switch panel 21 has a structure in which the glass substrate 22 and the glass cover 23 are directly glass-sealed, without interposing any spacer glass or other such spacer member. Glass-sealing is carried out by applying a low-melting point frit glass or glass paste sealant about the outside periphery of the glass substrate 22 and the glass cover 23, and baking this assembly (at about 480° C.). The space enclosed by the glass substrate 22, the glass cover 23, and the sealing glass is a glass-sealed space. By carrying out sealing under an inert gas atmosphere such as one of nitrogen, the glass-sealed space within which the sensor part 25 is arranged can be filled by the inert gas, preventing oxidative degradation of the sensor electrode. Additionally, to prevent degradation of the sensor electrode, it is preferable to conduct reduced-pressure sealing to bring the space to a vacuum (about $10^{-5}$ Pa is fine), so as to eliminate the effects of moisture and oxygen to the greatest possible extent. As shown in FIG. 7 (c), it is also preferable to provide the cover glass 23 with a vent hole 23a so that any air remaining inside the space can be vented.

According to this embodiment, the sensor part 25 which includes the sensor electrode 26 comprising an Al thin film is arranged within a glass-sealed space, thus minimizing susceptibility to the outside environment, and permitting use in harsh environments which have a wide temperature range from low temperature to high temperature, or in which moisture, acids, alkalies, dust, or the like are present. Moreover, due to the structure in which the glass substrate 22 and the glass cover 23 are superimposed and the sensor part 25 is sandwiched therebetween, the mechanical strength is better than with a structure of a single glass substrate, and breakage of the sensor electrode 26 and the wires thereof can be prevented, even in cases of exposure to strong vibration or pressure.

A control part (not shown in the illustration) for controlling touch detection by the sensor part 25 and the like is arranged outside the capacitive touch switch panel 21, and a connection terminal thereof is wired to the lead frame 24 by spot-welding or the like. By adopting the metal lead frame 24 as the outside connection terminal and making a wire connection by welding, usage in high-temperature environments, e.g. about 400° C., is possible.

In this embodiment, optionally, a structure in which spacer members are provided at the periphery of the glass substrate and the cover glass would also be acceptable. The lift height of the lead frame will be adjusted depending on whether or not spacer members are adopted. In cases in which the configuration includes spacer members, a structure in which the control part, and the illuminating light source such as an LED backlight, are included within the internal space of the capacitive touch switch panel can also be devised.

The glass substrate 22 and the glass cover 23 used can be the same as the glass substrate 2 of the embodiment shown in FIG. 1. The sensor electrode 26 of the sensor part 25 comprises an Al thin film, and is disposed on the opposite surface 22b from the touch surface 22a of the glass substrate 22. By employing an Al thin film for the sensor electrode, excellent environmental resistance characteristics are obtained, and costs are low. As the environmental resistance characteristics in this embodiment are particularly excellent, it is possible to also use a metal thin film other than an Al thin film for the sensor electrode. For example, the sensor electrode can be formed by widely known thin film formation techniques, using materials such as Al alloys, niobium, molybdenum, gold, silver, copper, or the like.

Figure 8:
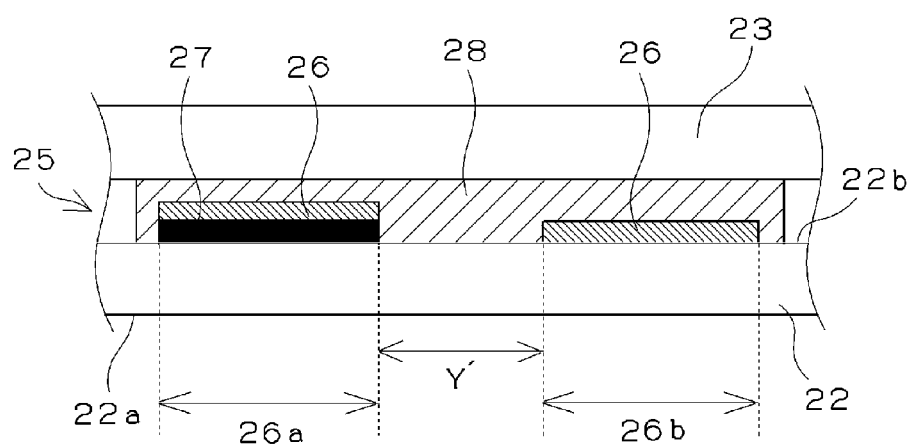
FIG. 8 is an enlarged schematic cross sectional view of the sensor part of FIG. 7.

FIG. 8 shows an enlarged schematic cross sectional view of the sensor part. In FIG. 8, the thickness of the sensor electrode is shown exaggerated beyond the actual thickness, for the purposes of description. As shown in FIG. 8, the sensor part 25 has a sensor electrode 26. In the region of a switch 26a, an intermediate layer 27 is formed between the Al thin film sensor electrode 26 and the glass substrate 22. The intermediate layer 27 is identical to that shown in FIG. 3 above, and is a layer that absorbs incident light through visible light interference, and appears black (black layer). Seen from the touch surface 22a, the switch 26a region appears black, a switch 26b region appears glossy silver, and a section Y' appears the color of the protective layer 28, respectively. The particulars of the formation method and the characteristics of the Al thin film sensor electrode and the intermediate layer are the same as in the embodiment shown in FIG. 3 above.

In FIG. 8, the sensor electrode 26 (and wiring) and a protective layer 28 are laminated in the stated order from the glass substrate 22 side, and the prescribed intermediate layer 27 is formed between the glass substrate 22 and at least portions of the sensor electrode 26 (and wiring). In this embodiment, as the sensor part is protected by the cover glass 23, a configuration lacking the protective layer 28 would also be acceptable. In the sensor part 25, a light-diffusion layer such as that shown in FIG. 2 above may be provided in spaces in the sensor electrode formed on the glass substrate on the surface side thereof on which the Al thin film has been formed, or at locations of light-transmissive parts (openings in the protective layer or the like) that are formed in the sensor electrode.

Figure 9:
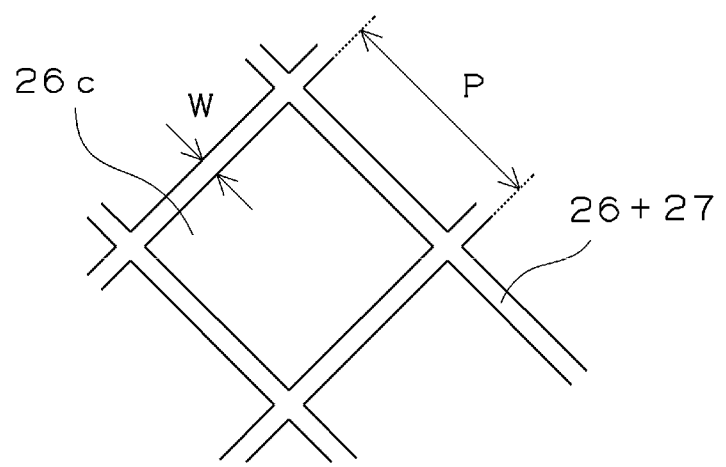
FIG. 9 is a fragmentary enlarged view of a sensor electrode of FIG. 7.

FIG. 9 shows an enlarged view of section X' in FIG. 7 (a). Section X' in FIG. 7 (a) is provided with a light-transmissive sensor electrode. As shown in FIG. 9, in this section, there is a lattice pattern in which the Al thin film (sensor electrode 26) and the intermediate layer 27 overlap, and the lattice interstices constitute openings 26c. This lattice pattern is a micro-lattice pattern identical to that of FIG. 4 (c) above, in which the switch-shaped sections are light-transmissive parts that appear transparent to the naked eye. The particulars of the lattice (the formation method, line width W, line pitch P, and the like are the same as in the embodiment shown in FIG. 4 (c). The structure of section X of FIG. 1 (a) is similar to that of this section X'.

Figure 10:
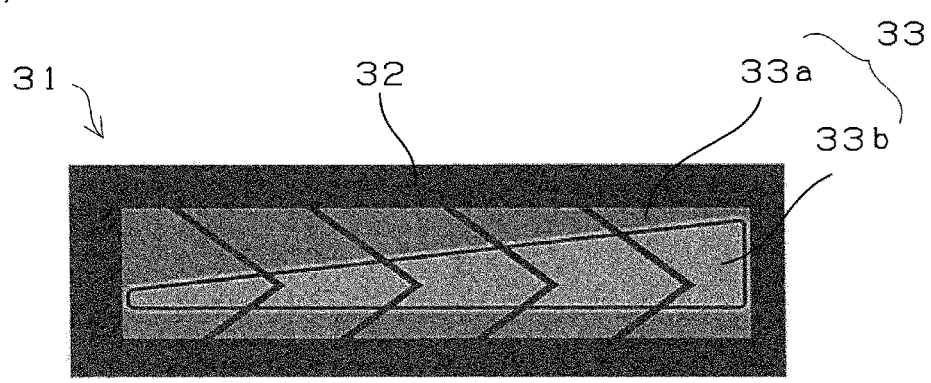
FIG. 10 is a plan view showing another example of the capacitive switch panel of the present invention.
Figure 10:
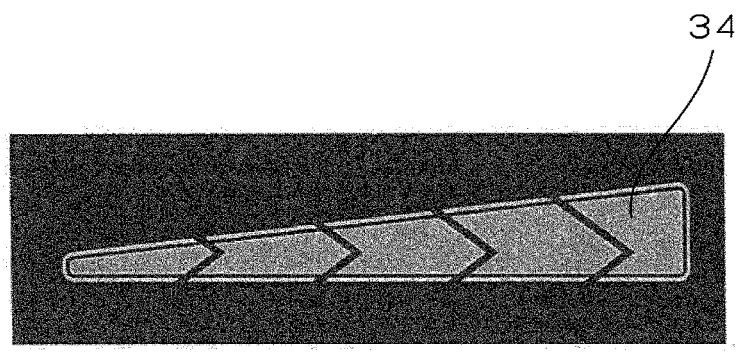
Figure 11:
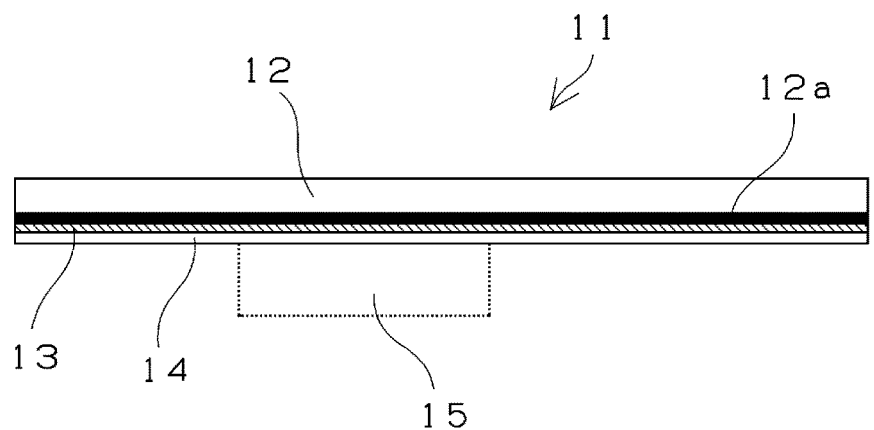
FIG. 11 is a side view showing a conventional capacitive switch panel.
Figure 12:
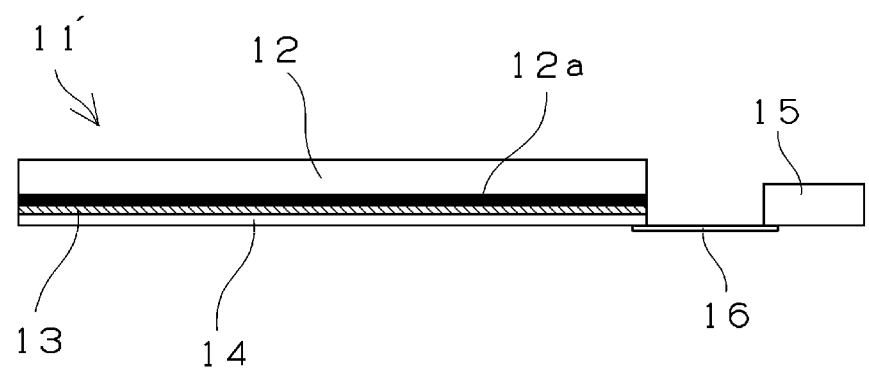
FIG. 12 is a side view showing a conventional capacitive switch panel.

Another example of the capacitive touch switch panel of the present invention will be described on the basis of FIG. 10. FIG. 10 (a) is a plan view showing the capacitive touch switch panel (slider pattern) of the present invention, and FIG. 10 (b) is a plan view showing a conventional capacitive touch switch panel (slider pattern). As shown in FIG. 10 (b), in the case of a typical slider pattern, it is necessary to form the pattern such that the area of the sensor electrode 34 varies; going from the left side towards the right side in the drawing, the areas of the steps (switches) that make up the sensor electrode 34 are not constant. In this case, the variation in the capacitance will not be constant across steps, and the control program used for recognition purposes will be complex.

The capacitive touch switch panel (slide pattern) shown in FIG. 10 (a) addresses this problem. As shown in FIG. 10 (a), this capacitive touch switch panel 31 has a light-transmissive glass substrate 32, and a sensor part 33 formed on the opposite surface side from the touch surface. The sensor part 33 has a plurality of sensor electrodes 33a divided in steps (switches) into substantially equal areas and sensor electrodes 33b formed to prescribed shapes, between the sensor electrodes 33a and the glass substrate 32 within the regions of the respective sensor electrodes 33a. The sensor electrodes 33a [are formed] through lamination of an Al thin film and an intermediate layer, and the electrodes appear black when viewed from the touch surface. By tinting the protective layer to make the background in sections other than the electrodes black, these sensor electrodes 33a, which are divided so as to be substantially equal in area, are assimilated into the background, and are not readily visible. The sensor electrodes 33b are formed by an Al thin film lacking an intermediate layer, so the electrodes appear glossy silver in color when viewed from the touch surface. The sensor electrodes 33b are formed to shapes (a slide pattern) such that the steps (switches) increase in area in stepwise fashion going from the left side towards the right side in the drawing. The particulars of the formation method and the characteristics of the Al thin film sensor electrodes and the intermediate layer are the same as in the embodiment shown in FIG. 3 above.

By providing such a sensor part 33, the designs that are visible from the touch surface form a slide pattern that varies in area in stepwise fashion, while the sensor electrodes that constitute the electrically conductive parts define steps that are substantially equal in area. In so doing, the change in capacitance can be made equal across the steps, and the control program for recognition can be simpler.

While embodiments of the capacitive touch switch panel have been described above with reference to the drawings, the configuration of the capacitive touch switch panel of the present invention is not limited thereto.

INDUSTRIAL APPLICABILITY

With the capacitive touch switch panel of the present invention, it is possible to form transparent sensor electrodes having shapes of high-quality design, and reduced reflectance of visible light, and for the panel to moreover have excellent appearance and ample environmental resistance making the panel suitable for utilization as an input device for various types of equipment such as household electronic appliances, AV equipment, PC/OA equipment, industrial machinery, and other electronic devices. Further, by providing a glass cover or the like, the panel can be adapted for utilization as an input device in machines used in harsh environments of low temperature or high temperature (about −50° C. to 430° C.) or in the presence of moisture (high humidity), acids, alkalies, dust, or the like, such as would be encountered when installed outdoors or in proximity to a heater or other such industrial machines of various kinds.

EXPLANATION OF NUMERALS AND CHARACTERS

1 Capacitive touch switch panel
2 Glass substrate
3 Sensor part
4 Sensor electrode
5 Intermediate layer
6 Protective layer
7 Light-diffusion layer
8 Wires
9 Flexible printed circuit (FPC)
10 Control part
21 Capacitive touch switch panel
22 Glass substrate
23 Cover glass
24 Lead frame
25 Sensor part
26 Sensor electrode
27 Intermediate layer
28 Protective layer
31 Capacitive touch switch panel (slider pattern)
32 Glass substrate
33 Sensor part
34 Sensor electrode

The invention claimed is:

1. A capacitive touch switch panel provided with a glass substrate, and a sensor part formed on this glass substrate, wherein the capacitive touch switch panel is characterized in that the sensor part has a sensor electrode, the sensor electrode comprising an aluminum thin film formed by sputtering or vacuum deposition in a switch configuration on the glass substrate at the opposite surface side from the touch surface thereof,
the sensor part having an intermediate layer between the glass substrate and at least a portion of the aluminum thin film, and the intermediate layer being a thin film that consists of a mixture of molybdenum and $Al_2O_3$.

2. The capacitive touch switch panel of claim 1, characterized by having light-transmissive parts in at least portions of the aluminum thin film, the light-transmissive parts having a lattice pattern in which the aluminum thin film and the intermediate layer overlap, with the lattice interstices constituting openings.

3. The capacitive touch switch panel of claim 1, characterized in that the sensor part has a protective layer for protecting the sensor electrode, the protective layer being formed on the glass substrate on the surface side on which the aluminum film has been formed.

4. The capacitive touch switch panel of claim 1, characterized in that the sensor part has a light-diffusion layer for diffusing light from an illuminating light source, the light-diffusion layer being formed in spaces in the sensor electrode that is formed on the glass substrate on the surface side on which the aluminum film has been formed, or the layer being formed at locations of light-transmissive parts formed in the sensor electrode.

5. The capacitive touch switch panel of claim 1, characterized in that the amount of $Al_2O_3$, contained relative to the total amount of the mixture is 2-16 wt. %.

6. The capacitive touch switch panel of claim 1, characterized by having, in an integrated arrangement, an illuminating light source, and a control part for performing touch detection by the sensor part and for driving the illuminating light source.

7. The capacitive touch switch panel of claim 1, characterized in that the capacitive touch switch panel has a cover glass disposed on the glass substrate on the surface where the sensor part is formed, the glass substrate and the cover glass being glass-sealed, and the sensor part being arranged within the glass-sealed space, and the capacitive touch switch panel has an external connection terminal made of metal, which is connected to the sensor part and extends outside from the glass-sealed space.

8. The capacitive touch switch panel of claim 7, characterized in that the glass substrate and the cover glass are glass-sealed directly by sealing glass, without spacer members interposed therebetween.

9. The capacitive touch switch panel of claim 7, characterized in that the glass-sealed space interior is a vacuum, or is filled with an inert gas.

* * * * *